United States Patent [19]
Shely et al.

[11] Patent Number: 4,779,744
[45] Date of Patent: Oct. 25, 1988

[54] GUIDE RAIL FOR SUPPORTING BOARDS
[75] Inventors: William Shely; Peter Wells, both of Chicago, Ill.
[73] Assignee: All-States Inc., Chicago, Ill.
[21] Appl. No.: 140,966
[22] Filed: Jan. 5, 1988

Related U.S. Application Data
[63] Continuation of Ser. No. 887,995, Jul. 18, 1986, abandoned.
[51] Int. Cl.⁴ .............................................. A47G 19/08
[52] U.S. Cl. ..................................... 211/41; 361/415
[58] Field of Search .................... 211/41, 26; 361/415
[56] References Cited
U.S. PATENT DOCUMENTS
3,714,513  1/1973  Marconi ............................ 211/41 X
4,007,403  2/1977  Fiege ................................ 211/41 X
4,019,099  4/1977  Calabro ............................ 211/41 X
4,232,356  11/1980  Saunders et al. ................. 211/41 X Primary Examiner—Ramon S. Britts
Assistant Examiner—Blair M. Johnson
Attorney, Agent, or Firm—Laff, Whitesel, Conte & Saret

[57] ABSTRACT

A printed circuit board guide rail has one or more detents projecting far enough into the area traversed by the board to apply a horizontal holding and an antivibration pressure thereto. A notch window is formed in the part of the rail under the detent to give it a fixed-fixed suspended leaf spring quality for minimumizing vibration. The unnotched remainder of the rail enables a printed circuit board to slide freely thereover. The rail is arched to give vertical stability.

6 Claims, 1 Drawing Sheet

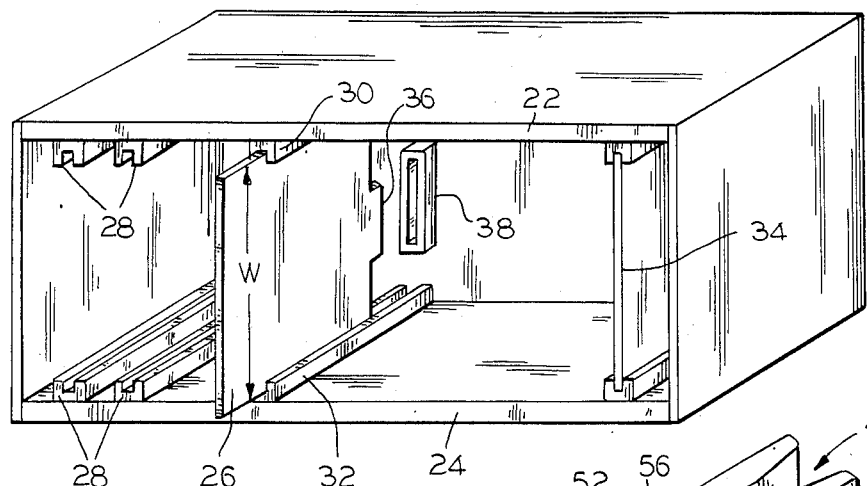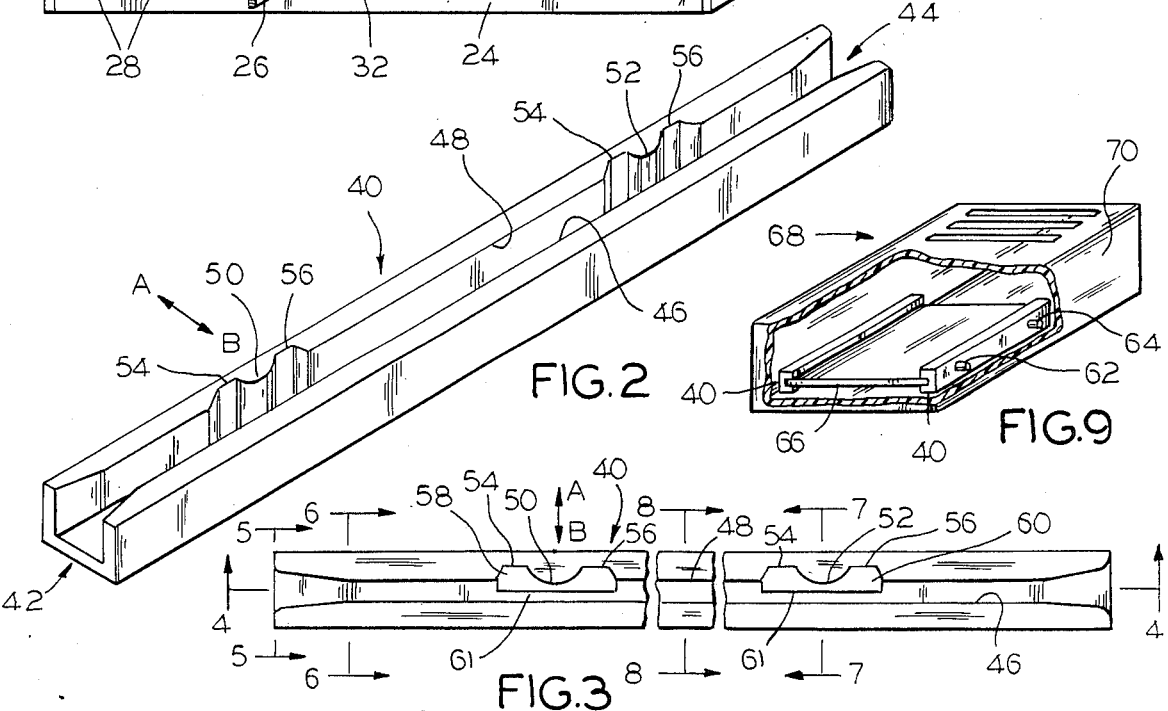

GUIDE RAIL FOR SUPPORTING BOARDS

This application is a continuation of application Ser. No. 887,995 filed July 18, 1986, now abandoned.

This invention relates to guide rails which may be used in library racks, for example, for printed circuit cards or boards and, more particularly, to rails or guides for receiving and supporting printed circuit cards.

Printed circuit cards or boards are well known devices for supporting and interconnecting electronic components. For example, a printed circuit board might be a fiber glass sheet of plastic which is about 3/64–⅛ inch thick, and almost any size from a few square inches to ten by twelve inches, or larger. Strips of conductive material are formed on at least one side of the board for interconnecting a plurality of points in order to provide intercomponent wiring. The components have electrodes which are mounted at these points. Therefore, to support the printed circuit boards, it is necessary to keep both sides of the board well away from any nearby objects, to prevent short circuits on one side, and to protect components on the other side.

When mounting a large number of printed circuit boards in close proximity, a common practice is to mount them in a library rack. A library rack usually has upper and lower shelves separated by a distance which corresponds to the width of a printed circuit board. A plurality of spaced parallel rails are mounted in vertical alignment on confronting surfaces of the shelves. The individual printed circuit boards are slid into corresponding pairs of vertically aligned rails, thus holding the opposite sides of the board away from all nearby objects.

The rails should be tight enough to keep the boards from vibrating and should be accurately positioned to hold the boards by only a very narrow area along the edges. They also should require only a minimum force to insert a board and be of a minimum size, while offering a great latitude in library rack design. Of course, the rails are not limited to library racks because the same rails may also be advantageously used in individual board installations, such as a pocket radio, for example.

Accordingly, an object of the invention is to provide new and improved rails for printed circuit board library racks, and the like. Here, an object is to provide a guide rail giving a more vibration-protected mount for printed circuit boards, which rail does not have increased dimensions, as compared to the dimensions of existing guide rails.

Another object of the invention is to provide a printed circuit board guide rail suitable for use in a library rack and yet also suitable for use in relatively small installations for individual printed circuit boards. In this connection, an object is to provide a design for printed circuit board guide rails which is extremely flexible in that printed circuit boards may be inserted from either end, and may be used in housings of many kinds.

Another object of this invention is to provide for certain mother-daughter board combinations.

In keeping with an aspect of the invention, a printed circuit board guide rail has a pair of detents projecting far enough into the area traversed by the board to apply an antivibration pressure thereto. A window or notch is formed in the rail beneath the detent to give it a freely suspended leaf spring quality for minimizing the insertion forces.

A preferred embodiment of the invention is shown in the attached drawing, wherein:

FIG. 1 is a perspective view which shows a library rack that uses the invention;

FIG. 2 is a prespective view of the inventive guide rail;

FIG. 3 is a top plan view of the inventive guide rail;

FIGS. 4–8 are longitudinal and cross-sectional end views taken along 4—4 to 8—8 respectively, of FIG. 3;

FIG. 9 is a perspective view showing the inventive guide rail used in a small unit, such as a pocket radio;

FIG. 10 is a perspective view showing the inventive rail used in a mother-daughter board combination; and FIG. 11 is an elevation view showing a component mounted in the guide rail.

A library rack 20 (FIG. 1) has upper and lower shelves 22, 24, separated by a distance generally corresponding to the width W of a printed circuit board 26. A plurality of spaced parallel guide rails generally numbered 28 are mounted in vertical alignment on confronting surfaces of the shelves 22, 24. For example, the printed circuit board 26 is shown being inserted into the vertically aligned pair of guide rails 30, 32. When the printed cirucit board is pushed into the rack as far as it will go (see printed circuit board 34), an edge 36 fits into a connector 38 at the back of the rack for completing electrical connections.

From an inspection of FIG. 1, it is apparent that the rails 28 hold only a very small portion along the opposing edges of the printed circuit board. Therefore, if there is any substantial amount of looseness, the printed circuit board could fall out of the rack. Also, if there are any vibrations, the board could be shaken out of the rack. Examples of uses where such vibration may occur are mobile installations and installations nn areas near heavily traveled highways or railroads. When the rails are used in single pairs, as in a "Walkie Talkie" portable radio housing, for example, the vibrations result from carrying the radios. Those who are familiar with the uses of printed circuit boards will think of many other reasons why a guide rail with a relatively tight fit is required or desirable.

On the other hand, if the fit is too tight, it becomes too difficult to install and remove the printed circuit boards. Sometimes, special extraction tools are required, which is cumbersome.

The invention provides an elongated printed circuit board guide rail 40 (FIG. 2) having outside dimensions which are no larger that the outside dimensions of conventional guide rails. Preferably guide rail 40 is a single unitary part made of molded nylon. The opposing ends have funnel-shaped openings 42, 44 to facilitate the insertion of the printed circuit board from either end. The cross section is somewhat U-shaped with a floor having two opposing upstanding side walls (FIGS. 5–8). One side wall of the guide rail has a smooth and unbroken surface 46, which is more or less similar to a conventional guide rail design.

Means are provided for stabilizing the board against horizontal movement. In greater detail, the other side wall of the guide rail has a surface 48 with any suitable number of detents 50, 52, projecting into the U-shaped cross section, each detent being defined by two relatively thin places on its opposite sides 54, 56. These thin parts form fixed-fixed leaf springs. (The term fixed-fixed means that each end of the spring is fixed, as opposed to a cantilever, for example, which is fixed-free because it is fixed on one end and free to vibrate on the other end).

FIGS. 3 and 7 show how the detents 50, 52 project into the center of the U-shaped cross-section and toward the opposing smooth and unbroken surface 46 of the side wall. In a very short guide rail, one detent may be enough, while in a very long guide rail three or more detents may be provided.

Means are provided for flexibly mounting the detent in the guide rail with out interfering with insertion of the printed circuit board. More particularly, the floor of the guide rails is notched out at 58, 60 so that each of the thin parts 54, 56 becomes a "leaf spring" which enables the detent to move back and forth in directions A and B, as the printed circuit board slides into and out of the guide rail. The resilience of the "leaf spring" acts somewhat as a shock absorber for any vibrations which may occur. Also, the resilance enables the board to be inserted and extracted by a minimum of force. It is important to note that the width of notches 58, 60 is much less than the thickness of a printed circuit board; therefore, the circuit board slides over a smooth and continuous surface at 61. There is no place where a corner of the board may be caught.

Two mounting posts 62, 64 are formed on the outside bottom of the guide rail so that it may be installed by being inserted into suitable mounting holes or perforations. As best seen in the cross sectional views of FIG. 5-8, these posts are bifurcated to add holding force. Moreover, the guide rail 40 is arched at its center 65 (FIG. 4). When two guide rails 30, 31 are in position as shown in FIG. 1, the printed circuit board applies a downward force c which deflects the arch at the center of the guide, thusly applying a light load to the board and eliminating any movement in a vertical direction. Also this spring action in direction c exerts lateral force which is provided by arch 65 and helps to hold the guide rails in place.

Other desired forms of anchor means may be provided in lieu of the bifurcated arms that are shown.

The guide rails may be used for any installation requiring the holding of a relatively narrow edge of an object. For example, FIG. 9 shows a relatively small printed circuit board 66 mounted in the housing of a pocket radio 68, by way of example, the inventive rails 40-40 are mounted on opposite sides of the radio housing 70. Obviously printed circuit board 66 may be horizontal, vertical, or in any other position, depending upon the physical position orientation of the pocket radio.

FIG. 10 shows, by way of example, a mother-daughter board arrangement. A relatively large printed circuit mother board 72 has two upstanding flanges 74, 76 mounted thereon. One of the inventive guide rails 40 is mounted on each of the upstanding flanges 74, 76. Therefore, the relatively small printed circuit daughter board 80 may be easily mounted in these guide rails. As any one familiar with mother-daughter board combinations knows, one board (usually the mother board) is commonly mounted horizontally while the other board (usually the daughter board) is mounted vertically.

In FIG. 11, the inventive guide rails 40-40 are used to mount an electrical component 82. More particularly, a chassis 84 may serve any useful purpose such as supporting electronic components, for example. Mounted in any suitable manner on the chassis are two upstanding flanges 74, 76, having the inventive guide rails 40, 40 mounted thereon. The component 82 may be any suitable device, such as a transformer, having oppositely directed flanges 86, 88 near the bottom. These flanges slip into the guide rails 40, 40. From an inspection of FIG. 11, it is obvious that flanges 86, 88 are horizontal, so that the weight rests on the guide rail.

The advantages of the invention should now be clear. There is an advantageous element of resistance to vibration, thus giving a somewhat shockproof mounting. The insertion forces required to mount the printed circuit board and the extraction forces required to remove it are held to a minimum, yet the external dimensions of the guide rail are no greater than the dimensions of conventional guide rails.

Those who are skilled in the art will readily perceive how to modify the invention. Therefore, the appended claims are to be construed to cover all equivalent structures which fall within the true scope and spirit of the invention.

The invention claimed is:

1. A unitary molded plastic guide rail for supporting electronic equipment mounted on a structure having a spaced parallel pair of flange-like edges, said guide rail comprising an elongated molded plastic member with a U-shaped cross section, said member having three contiguous and sides forming a bottom and two side walls in said U-shape, said sidewalls being continuously uninterrupted along the length thereof, one of the side walls being formed into at least two fixed-fixed springs with a detent projecting therefrom, towards the other of said sidewalls, the springs being located near opposite ends of said guide rail and comprising a portion of one of said uninterrupted side wall, the other of said side walls comprising a surface which is smooth and unbroken whereby said one side wall may support a weight when said guide rail supports a horizontally mounted board-like object or may fix a position of one side of a board like object when said guide rail positions a vertically mounted board-like object, the central one of said three contiguous sides having an open window extending only partially across said central side directly said fixed-fixed spring, whereby said spring is free to flex toward and away from the other side wall, while the material of said central side which remains adjacent this window forms an unbroken support surface for continously supporting a structure sliding through said guide rail, thus enabling three sides to receive and support said flange-like edge with said detent applying a spring bias against said edge.

2. The guide rail of claim 1 wherein said structure is a printed circuit board and said flange-like edges are opposite edges of said printed circuit board.

3. The guide rail of claim 1 wherein said structure is a first printed circuit board having said guide rail mounted thereon and a second printed circuit board mounted in said guide rail, said flange-like edge being an edge of said second printed circuit board.

4. The guide rail of claim 1 wherein said structure is a first printed circuit board having a guide rail mounted thereon and a component having said pair of flange-like edges projecting in opposite directions therefrom, said component being supported by said guide rail.

5. The guide rail of claim 1 wherein said central one of said sides has an elongated lower surface which has two mounting posts dependent therefrom and near opposite ends thereof with a slight arch between the mounting posts, a pressure which flattens the arch lengthening the elongated surface to move the posts apart and a release of said pressure causing said arch to reappear and shortening the distance between said posts as they move back to their original position, whereby the change in distance between said posts may cause them to grip mounting holes in an underlying chassis.

6. The guide rail of claim 1 and outwardly flared entrances formed on each of opposite ends of said side walls to guide and direct a device entering said guide rail.

* * * * *